United States Patent [19]

McCann, Jr.

[11] 3,808,476

[45] Apr. 30, 1974

[54] CHARGE PUMP PHOTODETECTOR

[75] Inventor: David H. McCann, Jr., Ellicott City, Md.

[73] Assignee: Westinghouse Electric Corporation, Pittsburgh, Pa.

[22] Filed: Jan. 5, 1973

[21] Appl. No.: 321,408

[52] U.S. Cl. ...... 317/235 R, 317/235 N, 250/211 J, 307/311

[51] Int. Cl. ........................................... H01l 15/00

[58] Field of Search ............ 317/235 N; 250/211 J; 307/311

[56] References Cited

UNITED STATES PATENTS

| | | | |
|---|---|---|---|
| 3,623,026 | 11/1971 | Engeler | 340/173 LS |
| 3,649,838 | 3/1972 | Phelan, Jr. | 250/211 J |
| 3,369,132 | 2/1968 | Fang | 307/299 |

*Primary Examiner*—Martin H. Edlow
*Attorney, Agent, or Firm*—D. Schron

[57] ABSTRACT

A three-terminal semiconductive photodetector which operates by detecting the carriers accumulated in an inversion layer formed between a semiconductor and a dielectric film when light falls on the device. The amount of charge in the inversion layer is proportional to the light falling on the device and the time during which a pulse of electrical energy is applied between the semiconductor and an electrode on the opposite side of the dielectric layer. The charge is collected by a reverse-biased p-n junction formed in the semiconductor material when the pulse inducing the inversion layer is removed.

5 Claims, 4 Drawing Figures

CHARGE PUMP PHOTODETECTOR

BACKGROUND OF THE INVENTION

Arrays of solid-state detectors have been constructed for many applications. For example, silicon arrays of phototransistors have been used as a replacement for a vidicon. Linear arrays of phototransistors and diodes have also been constructed in silicon for scanning applications; and arrays of similar devices have been constructed in germanium and the III-V compounds of the Periodic Table for imaging in the infrared regions of the electromagnetic spectrum.

While arrays of the type described above are generally satisfactory for their intended purposes, they have several disadvantages which degrade their performance as detectors. The first of these is that they are all two-terminal devices and suffer from feed-through noise during commutation for sequential readout. The second is that they all require oxide masking for geometry definition during high temperature diffusions.

SUMMARY OF THE INVENTION

In accordance with the present invention a new and improved three-terminal photodetector is provided which overcomes the foregoing and other disadvantages of prior art two-terminal devices.

Specifically, there is provided in accordance with the invention a charge pump photodetector comprising a substrate of semiconductive material of one type conductivity together with a layer of semiconductive material of the other type conductivity formed over the substrate to form a p-n junction between the two. The layer of semiconductive material of the other type conductivity can be applied by epitaxial techniques or otherwise diffused into the surface of the substrate. A layer of dielectric material is formed over the layer of semiconductive material of the other type conductivity; and in contact with the side of this dielectric layer opposite the semiconductive material is an electrode, preferably a transparent electrode. A source of driving potential and a load impedance are connected across the p-n junction; while a pulse generator or the like applies a pulse of electrical energy between the electrode and the layer of semiconductive material of the other type conductivity.

With this arrangement, and assuming that the pulse of electrical energy is of the proper polarity, an inversion layer will form between the semiconductive layer and the dielectric layer, the amount of charge in the inversion layer being proportional to the light falling on the device and the time during which the pulse persists. When the pulse is removed, the charge is collected by the p-n junction, which is reverse-biased, to produce a pulse across the load impedance whose maximum amplitude is a function of the intensity of the light falling on the device.

The above and other objects and features of the invention will become apparent from the following detailed description taken in connection with the accompanying drawings which form a part of this specification, and in which.

Figures 1, 2, 3:
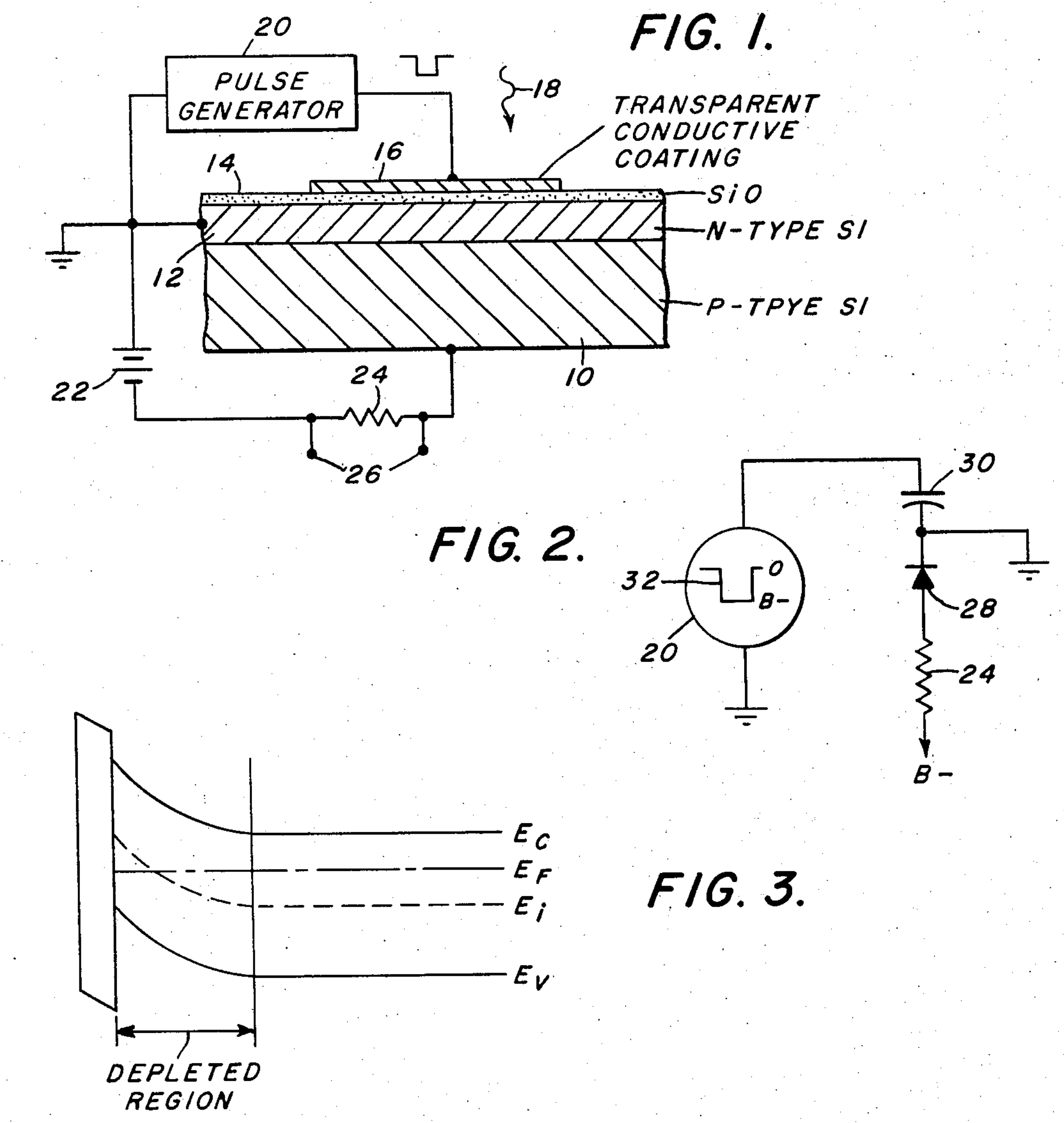
FIG. 1 is a cross-sectional view of one embodiment of the charge pump photodetector showing its connection to a load impedance and a source of driving potential, as well as the pulse generator.
FIG. 2 is an equivalent circuit diagram of the assembly of FIG. 1.
FIG. 3 is an illustration of the energy bands occurring in the device of FIG. 1 without the application of a pulse thereto.

With reference now to the drawings, and particularly to FIG. 1, there is shown a semiconductive device comprising a substrate 10 of P-type silicon having formed on the upper surface thereof a layer of N-type silicon 12. The layer 12 may be deposited by epitaxial techniques or by diffusion, depending upon requirements. Formed over the layer 12 is a layer of silicon dioxide 14; and above the layer 14 is an electrode 16 which preferably comprises a transparent conductive coating such as tin oxide.

The transparent electrode 16 permits light, indicated by the arrow 18, to pass through it and the silicon dioxide layer 14 into the body of semiconductive material. In this respect, the silicon dioxide layer 14 must be thin enough to permit light to pass therethrough while at the same time must be thick enough to electrically insulate the electrode 16 from the body of semiconductive material. Alternatively, the transparent electrode 16 can be replaced by an opaque electrode, such as a metalization. This metalization, however, must be of reduced area, again to permit the light to pass through the silicon dioxide layer and to the body of semiconductive material.

Connected between the electrode 16 and the layer 12 of N-type silicon is a pulse generator 20 adapted to apply a negative-going pulse to the electrode 16. Connected between the layer 12 and the layer 10 are a source of driving potential, such as battery 22, and a load resistor 24 across which an output will appear via terminals 26. It will be understood, of course, that the P-type and N-type layers can be reversed, in which case the polarity of the battery 22 would have to be reversed also. Furthermore, the silicon dioxide layer can be replaced by other suitable insulators such as silicon nitride.

As will be appreciated, the device shown in FIG. 1 is essentially an MOS capacitor over a p-n junction. The operation of the device can best be understood from the equivalent circuit of FIG. 2. The p-n junction formed between layers 10 and 12 is indicated by the diode identified by the reference numeral 28 in FIG. 2; while the capacitor formed between layer 12 and electrode 16 by virtue of the insulating layer 14 therebetween is indicated in FIG. 2 by the reference numeral 30. The p-n junction between layers 10 and 12 (indicated by the diode 28 in FIG. 2) is continually reverse-biased through the load resistor 24. The potential between the electrode 16 and the thin N-type layer 12 (represented by the capacitor 30 in FIG. 2) is maintained for most of the frame time at a negative voltage and at the end of the frame time is returned to ground. That is, the pulse generator 20 applies a negative-going pulse which extends from zero volts to possibly the B-voltage value of battery 22 and persists for a time equal to the desired frame time.

At the instant a negative bias is applied to the MOS capacitor 30, the energy bands within the semiconductive material are bent at the surface as shown in FIG.

Figure 4:
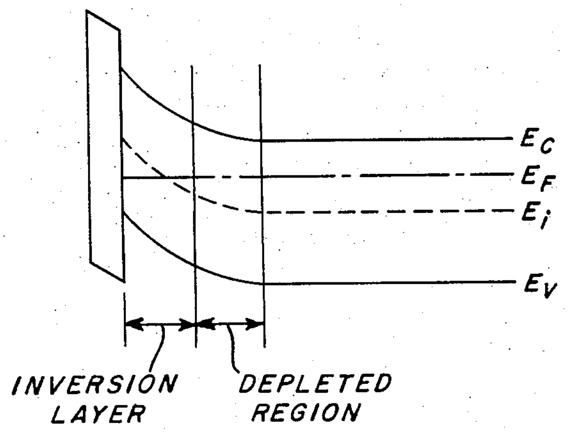
FIG. 4 is an illustration of the energy bands occurring in the device of FIG. 1 when light falls thereon and upon the application of a pulse thereto, showing the formation of an inversion layer therein.

3. If this voltage (i.e., that from battery 22) is large enough, an inversion layer will tend to form. The rate at which the inversion layer forms is dependent upon lifetime, heat and illumination. Therefore, if the inversion layer is examined after a given period of time, the amount of charge in the inversion layer is a measure of the light that has fallen on the device over the period, hence acting as an integrator. The inversion layer in terms of energy band diagrams is shown in FIG. 4.

When the capacitor 30 formed between elements 16 and 12 is short-circuited (i.e., at the termination of pulse 32), the depletion layer collapses with the dielectric constant of silicon, or in about $10^{-12}$ second. However, the charge that was in the inversion layer (free holes in this case) does not disappear as quickly. It now appears as minority carriers in the N-type layer 12. If the N-type layer 12 is thin enough, these carriers will be collected by the reverse-biased p-n junction in a manner exactly analogous to the action of the collector-base junction of a transistor. The result is a pulse of current appearing across the load resistor 24.

The amount of charge on the pulse (i.e., its maximum amplitude) is proportional to the light that has fallen on the device during the frame time, which is the persistence of the pulse 32. Since there is very little resistance between the ground contact and capacitor 30, there will be very little signal feed-through to the readout circuit. If the electric fields that exist in the depletion layer prior to creation of the inversion layer are large enough, avalanche multiplication may also be induced. This may be used to either enhance the signal or create a three-terminal device which is similar to an amplifier.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. A charge pump photodetector comprising a substrate of semiconductive material of one type conductivity, a layer of semiconductive material of the other type conductivity formed over said substrate to form a p-n junction between the two, a layer of dielectric material formed over said layer of semiconductive material of the other type conductivity, an electrically conductive electrode in contact with the side of said dielectric layer opposite the semiconductive material, a source of driving potential and a load impedance connected between said layer of semiconductive material of the other type conductivity and said substrate, and means for applying a pulse of electrical energy between said electrode and said layer of semiconductive material of the other type conductivity, the arrangement being such that when the pulse is removed, a signal will appear across said load impedance, said signal having a characteristic which varies as a function of the radiation falling on said semiconductive material while said pulse persists.

2. The photodetector of claim 1 wherein said electrode comprises transparent conductive material.

3. The photodetector of claim 1 wherein said substrate is of P-type conductivity, said layer of semiconductive material of the other type conductivity is N-type, said source of driving potential reverse biases the p-n junction formed between said substrate and said layer, and said pulse of electrical energy is a negative-going pulse.

4. The photodetector of claim 1 wherein said semiconductive material comprises silicon and said layer of dielectric material is selected from the group consisting of silicon dioxide and silicon nitride.

5. The photodetector of claim 1 wherein said layer of dielectric material is thin enough to permit light to pass therethrough.

* * * * *